United States Patent [19]
Andrews, Jr. et al.

[11] 3,964,084
[45] June 15, 1976

[54] SCHOTTKY BARRIER DIODE CONTACTS

[75] Inventors: John Marshall Andrews, Jr., South Whitehall, PA; Robert Morgan Ryder, Summit; Simon Min Sze, Murray Hill, both of N.J.

[73] Assignee: Bell Telephone Laboratories, Incorporated, Murray Hill, N.J.

[22] Filed: June 12, 1974

[21] Appl. No.: 478,506

[52] U.S. Cl. ............................................... 357/15
[51] Int. Cl.² ................ H01L 29/48; H01L 29/56; H01L 29/64
[58] Field of Search ..................... 357/15, 91, 90

[56] References Cited
UNITED STATES PATENTS

| | | | |
|---|---|---|---|
| 3,739,243 | 6/1973 | Semichon et al. | 357/15 |
| 3,767,984 | 10/1973 | Shinoda et al. | 357/15 |
| 3,808,477 | 4/1974 | Swank | 357/15 |

OTHER PUBLICATIONS

Appl. Phys. Letters, vol. 24, No. 8, 15 Apr. 1974, Shannon.

*Primary Examiner*—Edward J. Wojciechowicz
*Attorney, Agent, or Firm*—R. B. Anderson; L. C. Canepa

[57] ABSTRACT

A Schottky barrier contact includes a thin layer of high carrier concentration impurities ion implanted over the contact surface of the semiconductor. This reduces the electronic barrier height, increases the tunneling component, and thus reduces the forward-bias turn-on voltage of the diode. The implanted layer has a carrier concentration at least ten times that of the semiconductor substrate, and a thickness smaller than the width of the inherent depletion region resulting from the internally generated electric field at the metal-semiconductor interface. An implanted layer of the opposite conductivity type raises the barrier height.

5 Claims, 6 Drawing Figures

SCHOTTKY BARRIER DIODE CONTACTS

BACKGROUND OF THE INVENTION

This invention relates to Schottky barrier contacts, and more particularly, to techniques for modifying the electronic barriers of such contacts.

A Schottky barrier contact is a metal contact formed on a semiconductor wafer so as to establish a rectifying electronic barrier or junction. The barrier is created because of differences in work function of the metal and semiconductor and is conventionally characterized by a barrier height measured in electron-volts. An internally-generated electric field extends into the semiconductor from the metal and establishes a depletion region, even in the absence of any external voltage.

As is well known, Schottky barrier diodes are widely used as high-speed switching diodes, microwave mixer diodes, and voltage clamping diodes. Schottky barrier contacts are commonly used in integrated circuits in which the semiconductor substrate includes numerous other components. A specialized microwave device using Schottky barriers is the BARITT device described in the patent to D. J. Coleman et al. 3,625,514, issued June 27, 1972 and assigned to Bell Telephone Laboratories, Incorporated.

One common Schottky barrier contact comprises platinum bonded to silicon which forms a barrier having a height of about 0.87 electron-volts. Since the height of the Schottky barrier is determined by the combination of metal and semiconductor used, it is difficult to control the height of the barrier or otherwise to control the conditions under which current is transmitted across the barrier. Thus, platinum-silicon Schottky barrier diodes require a forward-bias turn-on voltage in excess of 0.6 volts. It has long been recognized that if the barrier could be lowered or otherwise modified, the forward turn-on voltage could be reduced and greater flexibility in device design could be obtained. Efforts have therefore been made to modify the barrier by etching the contact surface of the semiconductor, deforming the contact surface, and using other techniques. Various combinations of metal and semiconductor metals have been used, but all of these expedients typically require significant sacrifices of desirable electrical and mechanical characteristics and have not been used extensively.

SUMMARY OF THE INVENTION

We have found that the Schottky barrier can be controllably reduced by ion implanting impurities into the contact surface of the semiconductor, the impurities being of the same conductivity type but much larger carrier concentration than the semiconductor bulk. For dependable barrier modification, the thickness of the implanted layer should be smaller than the internally generated depletion layer. In other words, the thickness T of the implanted layer should conform to the relationship $$T \leq \sqrt{\frac{2\epsilon_s \phi_B}{qN_1}} \qquad (1)$$

where $\epsilon_s$ is the permittivity of the semiconductor, $\phi_B$ is the barrier height of the Schottky barrier, $q$ is the charge on a majority carrier and $N_1$ is the carrier concentration of the thin implanted layer. As will be shown later, barrier height reduction varies only as the one-fourth power of implanted carrier concentration, and so the implanted layer should have a carrier concentration at least ten times greater than that of the semiconductor substrate to be effective. As will be explained more fully later, with our technique, the Schottky barrier of a platinum-silicon diode is lowered and modified to give a reduced forward-bias turn-on voltage due to increased carrier transmission both over the barrier and, by tunneling, through the barrier.

If the same criteria are met, but the conductivity type of the implanted layer is opposite that of the semiconductor bulk, then the barrier height will be increased rather than reduced. This may be useful in BARITT fabrication as will be described later.

These and other objects, features and advantages of the invention will be better understood from a consideration of the following detailed description taken in conjunction with the accompanying drawing.

DRAWING DESCRIPTION

DETAILED DESCRIPTION

Figure 1:
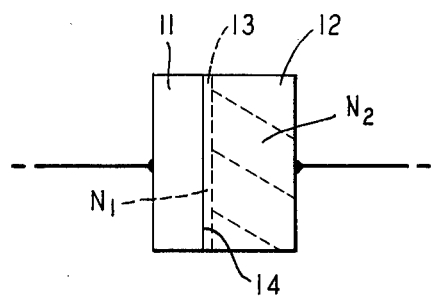
FIG. 1 is a sectional schematic view of a Schottky barrier diode in accordance with an illustrative embodiment of the invention.

Referring now to FIG. 1 there is shown a Schottky barrier diode in accordance with an illustrative embodiment of the invention comprising a metal contact 11 bonded to a semiconductor substrate 12. In accordance with the invention, the diode includes a thin layer 13 of ion implanted impurities at the contact surface of the semiconductor. The metal contact is appropriate for forming a Schottky barrier 14 with the semiconductor.

Except for the ion implant, the diode of FIG. 1 is of conventional structure and function. Phosphorus may be diffused into the silicon wafer to make the bulk of the substrate n-type, with a carrier concentration of about $10^{16}$ carriers/cm$^3$. The layer 13 is then formed by ion implanting phosphorus with a carrier concentration of $10^{19}$ carriers/cm$^3$ to a depth of 100 Angstroms, and then annealing. Platinum is evaporated onto the contact surface and sintered or reacted to form platinum-silicide, and gold is plated on the platinum for mechanical contacting purposes and good electrical conduction. As is known, the relative work function of silicon and platinum are appropriate for forming a rectifying Schottky barrier.

Figure 2:
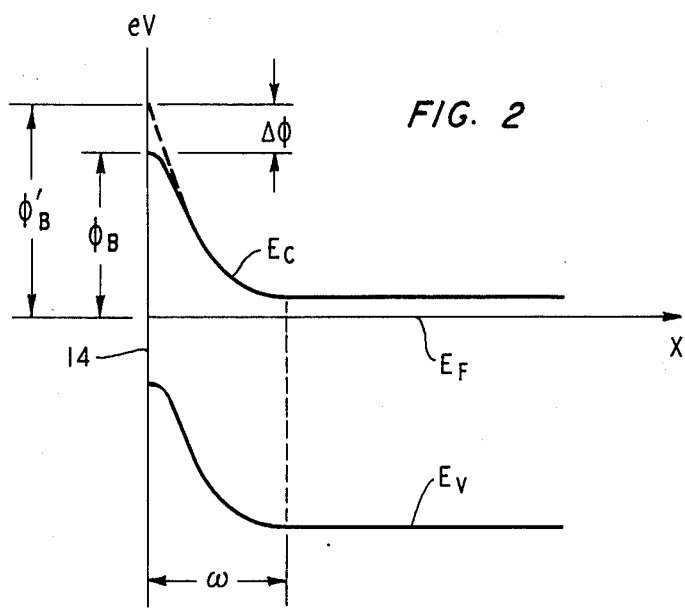
FIG. 2 is an energy band diagram of the diode of FIG. 1.

FIG. 2 is a graph of energy level versus distance in the semiconductor of FIG. 1, in which $E_c$ is the conduction band boundary $E_v$ is the valence band boundary and $E_f$ is the Fermi level. Reference number 14 designates the interface with the metal contact, i.e., the Schottky barrier, and the distance $x$ extends in a direction away from the metal. Without any externally applied voltage, an internally-generated electric field exists, giving rise to a depletion layer extending a distance W into the semiconductor. It is this field which causes the bending of the conduction and valence bands as shown, and the energy difference in electron volts of $E_c$ and $E_f$ at the interface 24 may be taken as the barrier height $\phi_B$. With the parameters given, $\phi_B$ is about 0.6 electron volts, which is significantly smaller than the barrier height $\phi_B'$ of 0.87 electron-volts which is normal for platinum-silicon contacts.

The reduced barrier height $\phi_B$ in accordance with the invention contributes to an additional tunneling component as well as to an increased thermionic component of injected current. That is, some current carriers having energy levels lower than the barrier height will nevertheless flow through the barrier according to the principle of tunneling. Current carriers that are at energy levels higher than the barrier height will of course flow across the barrier by thermionic conduction. It can be shown, however, that both of these components, the tunneling and thermionic components, are increased when the barrier height is reduced from $\phi_B'$ to $\phi_B$ as shown in FIG. 2.

Figure 3:
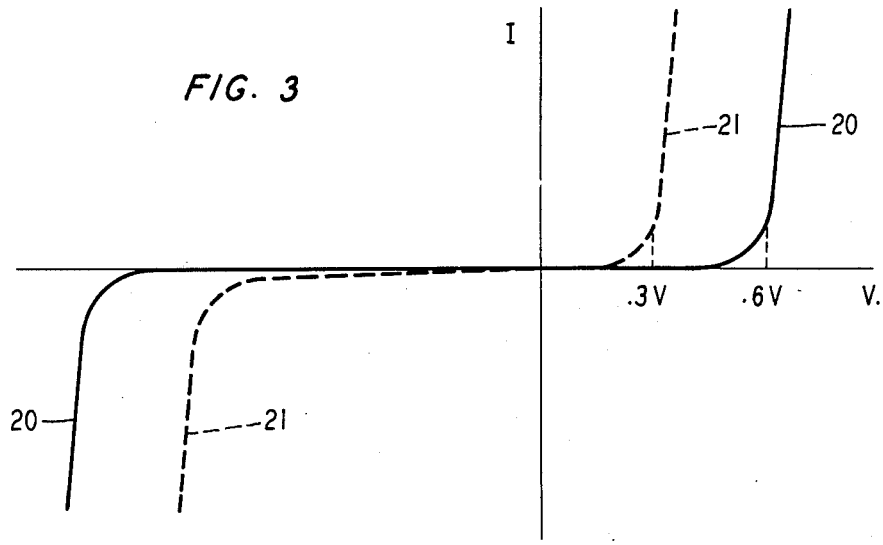
FIG. 3 is a current-voltage graph of the device of FIG. 1.

The modification of the barrier of course affects the current-voltage characteristic as shown in FIG. 3. Normally, a Schottky barrier diode would have the characteristic shown by the solid line 20, with a turn-on voltage or knee voltage of about 0.6 volts. With the increased current flow across the barrier in accordance with the invention, the turn-on voltage is reduced to 0.3 volts as shown by the dotted characteristic 21. Incidentally, it can also be shown that, with the invention, the reverse avalanche breakdown voltage is reduced and the reverse leakage component is slightly increased due to some tunneling. These effects are shown by a comparison of characteristics 20 and 21, but for many circuit applications they will be of no consequence. Generally speaking, the reverse-bias rectifying barrier is unaffected by the ion implant and is as effective as if the entire semiconductor were of the bulk conductivity; in this case, $10^{16}$ carriers/cm³. In particular, the reverse-bias barrier height is unaffected.

Referring again to FIG. 2, it should be noted that the invention effectively reduces the forward-bias barrier height by a value $\Delta\phi$ which can be shown to be defined by the relation $$\Delta\phi = \sqrt{\frac{qE_m}{4\pi\epsilon_s}} \qquad (2)$$

where $E_m$ is the maximum internally generated electric field at the meta-semiconductor interface and is given by the relation $$E_m = \sqrt{\frac{2qN_1(\phi_B - V)}{\epsilon_s}} \qquad (3)$$

where $V$ is the applied voltage. From Equations (2) and (3) $\Delta\phi$ can be written as $$\Delta\phi = \left(\frac{q}{4\pi\epsilon_s}\right)^{1/2} \left(\frac{2qN_1(\phi_B - V)}{\epsilon_s}\right)^{1/4} \qquad (4)$$

It can be seen that the barrier height reduction changes as a function of $N_1$ to the one-fourth power. Therefore, it is important that $N_1$ be high, and for the invention to be effective, it can be shown that $N_1$ should be greater than $10N_2$.

It can further be shown that for the device to provide a dependable blocking contact in the reverse direction, and therefore for the device to be effective, the thickness T of the impurity layer 13 must be smaller than the depletion width W, or, stated in another way, $$T \leq \sqrt{\frac{2\epsilon_s \phi_B}{qN_1}}. \qquad (5)$$

With this condition met the depletion width at reverse bias will of course be significantly larger than the implanted layer thickness T and current will be blocked. If T were substantially larger than the value dictated by Equation (5), the reverse-bias barrier would be determined by the carrier concentration (doping level) $N_1$ rather than $N_2$, with a consequent sacrifice of dependable rectification. Essentially, the invention permits the forward-bias barrier to be determined by one doping level $N_1$ and the reverse-bias barrier by another doping level $N_2$.

Compliance with Equation (5) essentially requires that ion implantation techniques be used for making the impurity layer since other processes would be incapable of making it so thin. Ion implantation is a term well understood in the art which refers to the projecting of impurity ions through a semiconductor surface to controlled depths and is described, for example, in the paper by J. R. Gibbons, *Proceedings of the Institute of Electrical and Electronics Engineers*, Vol. 56, No. 3, March 1968, p. 295.

An implanted concentration $N_1$ of $10^{19}$ is a convenient choice because implantation to a depth of 100 Angstroms is reasonably easy. If $N_1$ were $10^{20}$ carriers/cm³, then W would be 32 Angstroms; if $N_1$ were $10^{21}$, W would be only 10 Angstroms. If $N_1$ were $10^{18}$, W would be 320 Angstroms, but by Equation (4), this would provide a significantly smaller barrier height reduction $\Delta\phi$. For technical completeness it should be understood that $N_1$ equals the implanted impurity plus the background or bulk impurity $N_2$, since both impurities are of the same conductivity type. However, because the implanted impurity density is typically several orders of magnitude larger than $N_2$, $N_1$ is ordinarily independent of $N_2$.

Just as an impurity layer of the same conductivity type as the bulk reduces the barrier height, it can be shown that implantation of an impurity having a conductivity type opposite that of the bulk will increase the barrier height. Thus, in FIG. 2, if layer 13 were p-type with a net carrier concentration of $10^{19}$ carriers/cm³, the barrier height would be raised by about 0.27 electron-volts rather than being reduced. With the rectifying diode described, this simply would increase the turn-on voltage and would serve no readily apparent useful purpose. However, this technique can improve substantially operation efficiency in the BARITT diode; i.e., the diode described in the aforementioned Coleman et al. patent.

Figure 4:
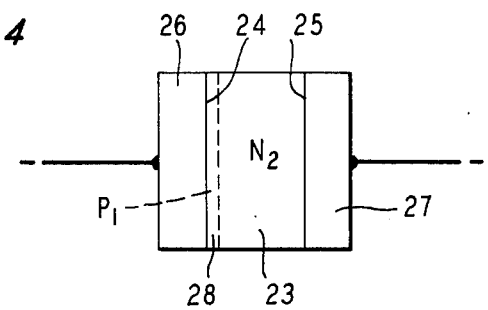
FIG. 4 shows a BARITT diode in accordance with another embodiment of the invention.

Referring to FIG. 4, the BARITT diode comprises a semiconductor wafer 23 included between opposite Schottky barrier junctions 24 and 25 defined respectively by metal contacts 26 and 27. As described in the Coleman et al. patent, the diode is capable of generating a negative resistance through the injection of minority carriers into the wafer during each cycle of an alternating voltage applied by a power supply and a circuit resonator (not shown). Injection occurs at a threshold voltage determined by the minority carrier barrier. By increasing the majority carrier barrier, in accordance with the invention, one can effectively reduce the minority carrier barrier, increase the density of injected minority carriers during each cycle, and thereby improve device efficiency.

Figure 5:
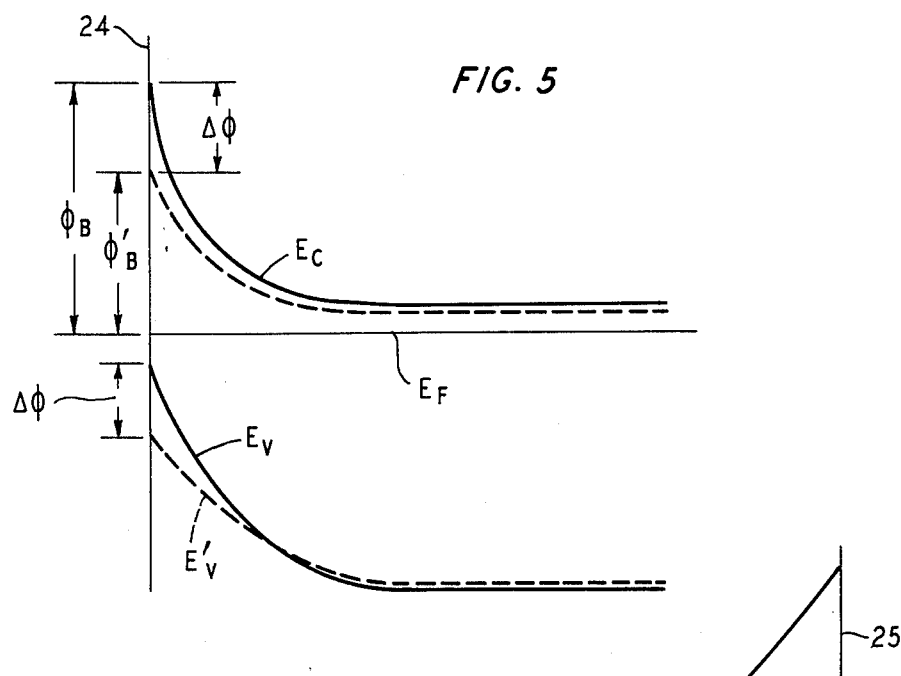
FIGS. 5 and 6 are energy band diagrams useful in explaining its operation.

Consider the device of FIG. 4 to have an n-type bulk conductivity $N_2$ and a thin implanted layer 28 of p-type conductivity with a carrier concentration $P_1$ which meets the criteria of Equations (4) and (5). In FIG. 5, the barrier height $\phi_B'$ indicates the normal barrier height in the absence of the implanted layer; $\phi_B$ is the majority carrier barrier height as increased by the value $\Delta\phi$ due to the implanted layer 28. It can be shown that the energy level in electron-volts of the valence band boundary $E_V$ is increased by the same value $\Delta\phi$.

Figure 6:
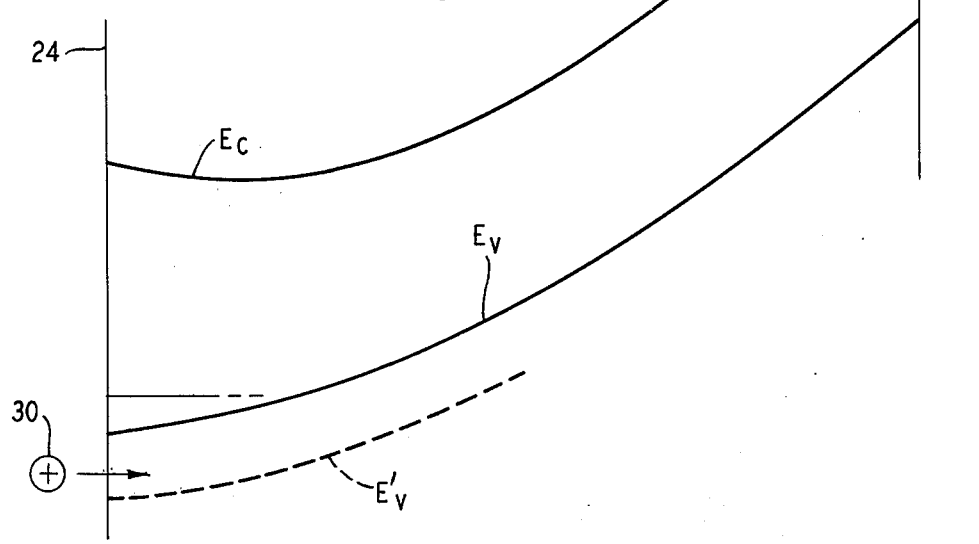

As described in detail in the Coleman et al. case, injection occurs when the injecting contact is forward-biased and the collecting contact is reverse-biased, a condition illustrated in FIG. 6 in which barrier 24 is the injecting junction and 25 is the collecting junction, corresponding to FIG. 4. Injection occurs when the applied voltage "reaches through" the entire wafer and becomes a maximum when the "flat-band" voltage as shown in FIG. 6 is achieved. When this occurs, a typical hole (or minority carrier) 30 is injected into the semiconductor. This injection, by thermionic conduction, is possible because hole 30 is at a lower energy level than the valence band boundary $E_V$; whereas, in the absence of the invention, it would be at a higher level than the boundary $E_V'$, and could not be so injected. This demonstrates that a lower voltage threshold and a greater current density by minority carrier injection occurs with the implanted p-type layer 28 of FIG. 4.

The p-type implantation can be made in a known manner by projecting boron ions to the silicon surface in a known manner. The net impurity density is technically equal to the implanted impurity density $P_1$ minus the background concentration $N_2$, which, as before, is ordinarily insignificant.

From the foregoing, it can be appreciated that the present invention provides great flexibility in the fabrication of a number of different devices. By using the invention, the designer may choose metal-semiconductor combinations so as to provide optimum stability, fabrication convenience, or other desired qualities, rather than being constrained by the barrier height and current transmission requirements. It is to be understood that the invention is applicable to metal-semiconductor interfaces in general rather than merely platinum-silicon device combinations; particularly, aluminum and gold are also widely used barrier contacts to silicon. Conductivities complementary to those described may of course be used, as well as different semiconductor materials. In any case, if the implanted layer is of the same conductivity type as the bulk it will reduce the barrier height, and if it is of the opposite type it will raise the barrier height, as described previously.

The particular embodiment described is intended to be merely illustrative of the inventive concept. Various other embodiments and modifications may be made by those skilled in the art without departing from the spirit and scope of the invention.

What is claimed is:

1. A semiconductive device which comprises a semiconductive member and a pair of electrode connections thereto defining a path of current flow therebetween through said member of which at least one of the connections forms in the member in the path of current flow both a rectifying barrier and an internally generated depletion layer characterized in that said one connection contacts a region of the semiconductive member which has along the path of current flow a thickness smaller than the thickness of the internally generated depletion layer and also has a carrier concentration at least ten times that of the portion of the member adjacent said region in the path of current flow, and the other of said connections is so located that said portion is serially in the current path between the two connections.

2. A semiconductive diode in accordance with claim 1 in which there are only two electrode connections to the semiconductive member and these are located on opposite surfaces of the member.

3. A semiconductive diode in accordance with claim 2 in which each of the two connections forms a rectifying barrier in the member, and in which said region is of the oppositive conductivity type to said portion of the member.

4. A semiconductive device in accordance with claim 1 in which the member is of silicon, the one connection is of platinum silicide, the region is about 100 Angstroms thick and its carrier concentration is about 1000 times that of the portion adjacent such region.

5. A semiconductive diode in accordance with claim 2, wherein said region is of the same conductivity type as said portion of the semiconductive member.

* * * * *

UNITED STATES PATENT AND TRADEMARK OFFICE
Certificate

Patent No. 3,964,084     Patented June 15, 1976

John Marshall Andrews, Jr., Robert Morgan Ryder & Simon Min Sze

Application having been made by John Marshall Andrews, Jr., Robert Morgan Ryder and Simon Min Sze, the inventors named in the patent above identified, and Bell Telephone Laboratories, Inc., Murray Hill, N.J., a corp. of N.Y., the assignee, for the issuance of a certificate under the provisions of Title 35, Section 256, of the United States Code, deleting the name of the said John M. Andrews, Jr. as a joint inventor, and a showing and proof of facts satisfying the requirements of the said section having been submitted, it is this 23rd day of Nov., 1982, certified that the name of the said John M. Andrews, Jr. is hereby deleted from the said patent as a joint inventor with the said Robert Morgan Ryder and Simon Min Sze.

Fred W. Sherling
*Associate Solicitor.*